(12) United States Patent
Cheng et al.

(10) Patent No.: US 7,675,087 B1
(45) Date of Patent: Mar. 9, 2010

(54) SURFACE MOUNT LIGHT EMITTING DEVICE

(76) Inventors: Wen-Tsung Cheng, No.78 Chao-Chou St., Taoyuan (TW); Wen-Ho Cheng, No.78 Chao-Chou St., Taoyuan (TW)

( * ) Notice: Subject to any disclaimer, the term of this patent is extended or adjusted under 35 U.S.C. 154(b) by 0 days.

(21) Appl. No.: 12/325,492

(22) Filed: Dec. 1, 2008

(51) Int. Cl.
  *H01L 33/00* (2006.01)
(52) U.S. Cl. .................................. 257/99; 257/E33.057
(58) Field of Classification Search .................. 257/99, 257/E33.057
  See application file for complete search history.

(56) References Cited

U.S. PATENT DOCUMENTS

2008/0111658 A1* 5/2008 Yang .......................... 337/242

2009/0045428 A1* 2/2009 Lin ............................. 257/99

* cited by examiner

*Primary Examiner*—Trung Dang
(74) *Attorney, Agent, or Firm*—Chun-Ming Shih

(57) ABSTRACT

A surface mount light emitting device includes a substrate, a chip set, a wire set and an encapsulator. The substrate includes a base plate with four corners and four electrode layers arranged on the corners, each electrode layer has a top electrode extended to the top surface of the base plate, a bottom electrode extended to the bottom surface of the base plate and a trace extended toward the center of the top surface of the base plate. The chip set includes two resistor chips and two light emitting chips, the resistor chips arranged on two of the traces extended from two diagonal corners, the light emitting chips respectively arranged on the other two traces extended from the other two diagonal corners. The wire set includes two fuse wires electrically connected the resistor chips to the light emitting chips. The encapsulator is encapsulating the chip set and the wire set.

6 Claims, 2 Drawing Sheets

SURFACE MOUNT LIGHT EMITTING DEVICE

BACKGROUND OF THE INVENTION

1. Field of the Invention

The present invention relates to a light emitting device, in particular to a surface mount light emitting device.

2. Description of Related Art

Safety fuses in car or other vehicle are electrically connected to control circuit of the car to prevent the control circuit from damaging by suddenly reverse current generated when the car is igniting or the switches thereof are turned on.

Conventional safety fuse includes a fuse wire electrically connecting between two conductive stripes which are packaged together in a shell. Once the fuse wire is burned out, it will not be possible to observe by a user outside the shell. The user has to plug and test all the safety fuses in a car one by one and consequently it wastes a lot of time. In order to improve the efficiency of the test, a low resistance light emitting diode is added into the safety fuse and is electrically connected between the two conductive stripes thereof. When the fuse wire is burned out, electrical current will flows into the light emitting diode to light it on. Therefore, after the safety fuse box is opened, the lighted-on blown safety fuse can notice the user for replacement.

But, since the low resistance light emitting diode is easy to burn out under a great amount of instantaneous current, a high resistance resistor is further electrically connected between the light emitting diode and one of the conductive stripes to limit maximum current flow to protect the light emitting diode. However, the multiple connections of the components of the safety fuse increase the difficulty of manufacturing.

SUMMARY OF THE INVENTION

The subject of present invention is to provide a surface mount light emitting device having resistance characteristic, which can be electrically connected between two conductive stripes of a safety fuse, capable of being installed between two conductive stripes of the safety fuse and bearing greater current flow when the light emitting device is lighted on.

In order to achieve aforementioned purpose, the present invention provides a surface mount light emitting device, including a substrate, a chip set, a wire set and an encapsulator. The substrate includes a base plate with four corners and four electrode layers arranged on the corners respectively, each electrode layer has a top electrode extended to the top surface of the base plate, a bottom electrode extended to the bottom surface of the base plate and a trace extended from the top electrodes and further extended toward the center of the top surface of the base plate. The chip set includes two resistor chips and two light emitting chips, the two resistor chips respectively arranged on two of the traces extended from two diagonal corners, the two light emitting chips respectively arranged on the other two traces extended from the other two diagonal corners. The wire set includes a fuse wire electrically connected one of the resistor chip to one of the light emitting chip and having another fuse wire electrically connected the other one resistor chip to the other one light emitting chip. The encapsulator is arranged on the substrate and encapsulating the chip set and the wire set.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

A detailed description of the present invention will be made with reference to the accompanying drawings.

Figure 1:
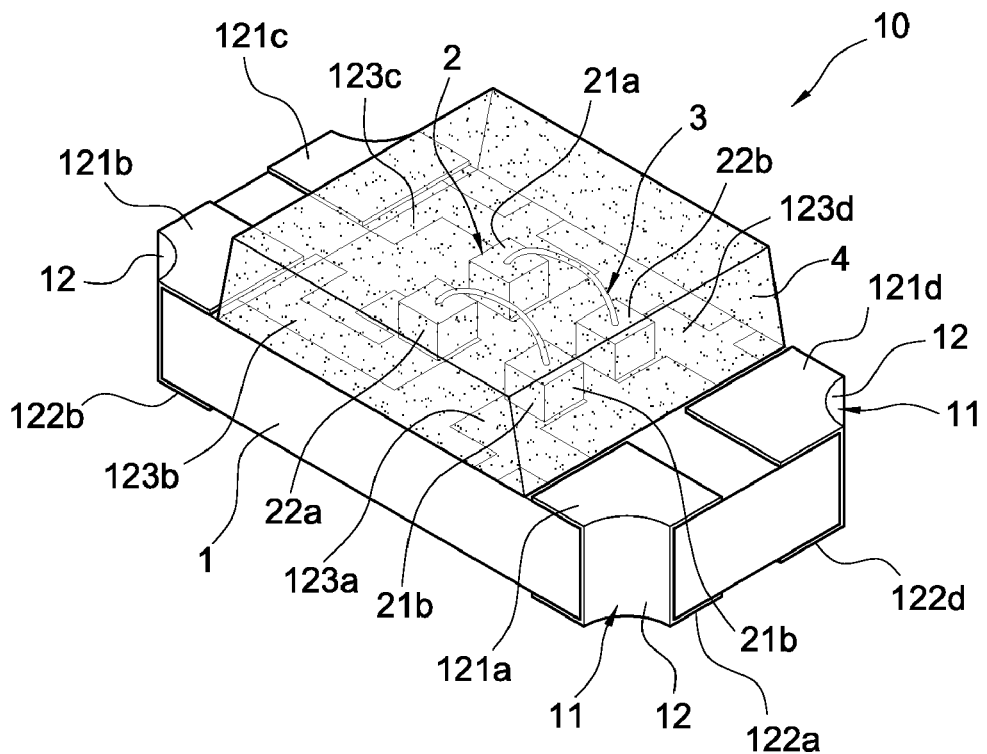
FIG. 1 is a perspective view of a surface mount light emitting device of the present invention.
Figure 2:
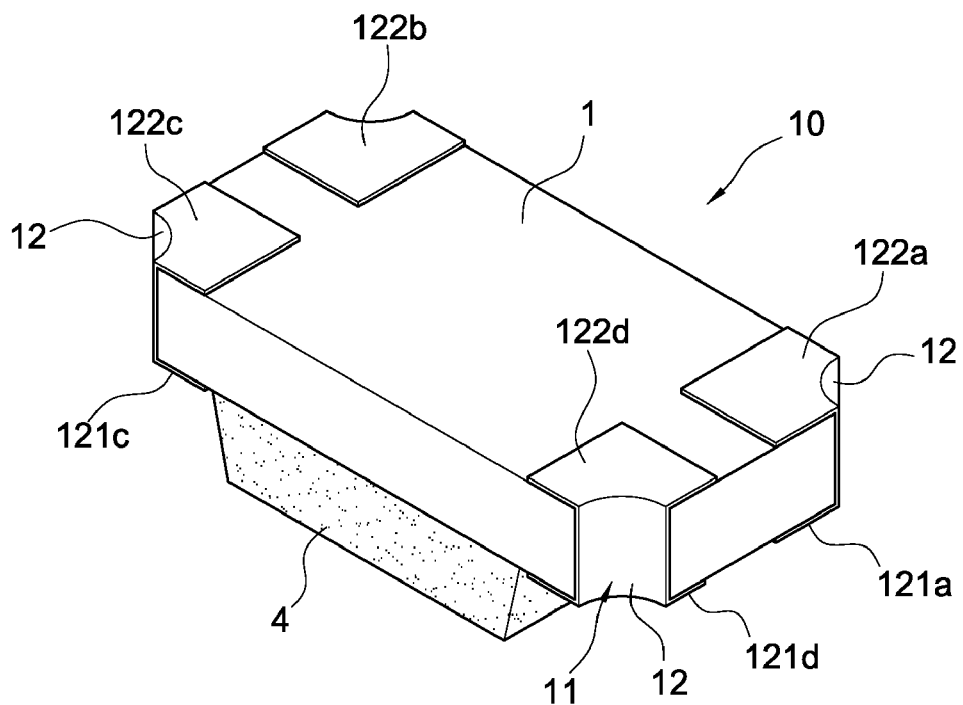
FIG. 2 is another perspective view of the surface mount light emitting device of the present invention.

FIG. 1 and FIG. 2 are two different perspective views of the surface mount light emitting device of the present invention. The surface mount light emitting device 10 includes a substrate 1, a chip set 2, a wire set 3 and an encapsulator 4.

The substrate 1 includes a base plate with four corners. Four indent portions 11 are formed on the four corners of the base plate. The substrate 1 also includes four electrode layers 12 arranged on the four indent portions 11 of the base plate, respectively. The electrode layers 12 are made of metal material by lithography or printing method. The electrode layers 12 have top electrodes 121a, 121b, 121c, 121d extended to the top surface of the substrate 1, bottom electrodes 122a, 122b, 122c, 122d extended to the bottom surface of the substrate 1 and traces 123a, 123b, 123c, 123d extended from the top electrodes 121a, 121b, 121c, 121d and extended toward the center of the top surface of the substrate 1. In this embodiment, the electrode layers 12 are made from copper foil.

The chip set 2 includes two resistor chips 21a, 21b and two light emitting chips 22a, 22b. The two resistor chips 21a, 21b are respectively arranged on two of the traces 123a, 123c extended from two diagonal corners of the base plate, and the two light emitting chips 22a, 22b are respectively arranged on the other two traces 123b, 123d extended from the other two diagonal corners of the base plate. In this embodiment, the resistor chips 21a, 21b are current limiting resistors for protecting the light emitting chips 22a, 22b.

The wire set 3 has a fuse wire electrically connected one of the resistor chip 21a to one of the light emitting chip 22b and has another fuse wire electrically connected the other one resistor chip 21b to the other one light emitting chip 22a. In other words, the resistor chip 21a and the light emitting chip 22b are electrically connected in series and the resistor chip 21b and the light emitting chip 22a are electrically connected in series. The fuse wires of the wire set 3 in this embodiment are gold wires.

The encapsulator 4 is arranged on the substrate 1 and encapsulates the chip set 2 and the wire set 3 for protecting the chip set 2 and the wire set 3 from damage. Further, the encapsulator 4 is also used as an optical lens of the surface mount light emitting device.

While a positive voltage is applied on the bottom electrode 122c and a negative voltage is applied on the bottom electrode 122d, the electrical current flows into the resistor chip 21a and light emitting chip 22b and lights on the light emitting chip 22b. Similarly, while a positive voltage is applied on the bottom electrode 122a and a negative voltage is applied on the bottom electrode 122b, the electrical current flows into the resistor chip 21b and light emitting chip 22a and lights on the light emitting chip 22a.

Figure 3:
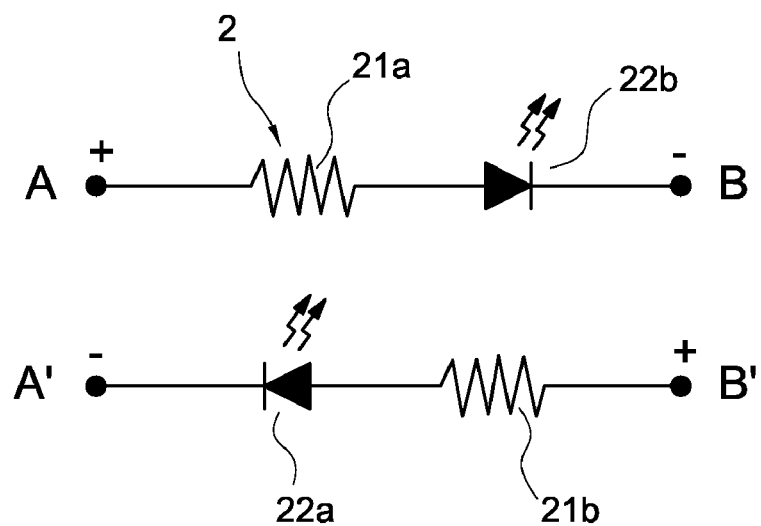
FIG. 3 is a equivalent circuit diagram of the surface mount light emitting device of the present invention.

FIG. 3 shows an equivalent circuit diagram of the surface mount light emitting device of the present invention. The equivalent circuit includes two independent sets of circuits. First set of circuit includes the resistor chip 21a and the light emitting chip 22b electrically connected in series. Second set of circuit includes the resistor chip 21b and the light emitting chip 22a electrically connected in series.

While a positive voltage is applied on the input end A (bottom electrode 122c) of the resistor chip 21a of the first set of circuit and a negative voltage is applied on the input end B (bottom electrode 122d) of the light emitting chip 22b, the light emitting chip 22b will be lighted on. Similarly, while a positive voltage is applied on the input end B' (bottom electrode 122a) of the resistor chip 21b of the second set of circuit and a negative voltage is applied on the input end A' (bottom electrode 122b) of the light emitting chip 22a, the light emitting chip 22a will be lighted on. Therefore, a light emitting circuit with polarity is made of the aforementioned first set of circuit and second set of circuit.

Figure 4:
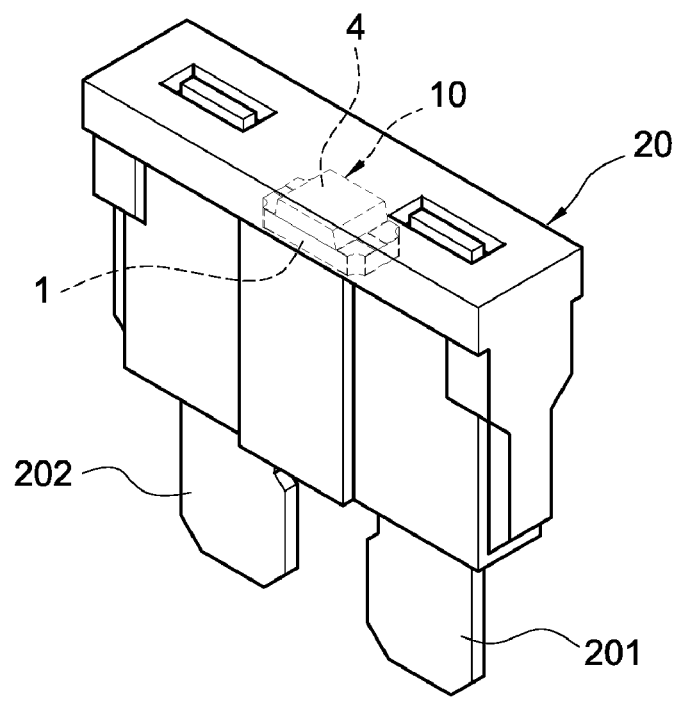
FIG. 4 is a perspective view of car safety fuse with the surface mount light emitting device of the present invention.

FIG. 4 shows a car safety fuse with the surface mount light emitting device of the present invention. The surface mount light emitting device is installed in a shell 20 of the safety fuse. The bottom electrodes 122a and 122d are electrical connected to a right side conductive stripe 201 in the shell 20 of the safety fuse. The bottom electrodes 122b and 122c are electrical connected to a left side conductive stripe 202 in the shell 20 of the safety fuse. Therefore, the light emitting circuit with polarity becomes a safety fuse with polarity-less operation. When the fuse wire electrically connected between the conductive stripes 201 and 202 are blown by the instantaneous large current flowed from the conductive stripe 201 or 202, at least one of the light emitting chips 22a, 22b will light on to notice the user for replacement.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A surface mount light emitting device, comprising:
   a substrate comprising a base plate with four corners and four electrode layers arranged on the corners respectively, each electrode layer has a top electrode extended to the top surface of the base plate, a bottom electrode extended to the bottom surface of the base plate and a trace extended from the top electrodes and further extended toward the center of the top surface of the base plate;
   a chip set comprising two resistor chips and two light emitting chips, the two resistor chips respectively arranged on two of the traces extended from two diagonal corners, the two light emitting chips respectively arranged on the other two traces extended from the other two diagonal corners;
   a wire set having a fuse wire electrically connected one of the resistor chip to one of the light emitting chip and having another fuse wire electrically connected the other one resistor chip to the other one light emitting chip; and
   an encapsulator arranged on the substrate and encapsulating the chip set and the wire set.

2. The device according to claim 1, wherein the base plate is made of insulating material.

3. The device according to claim 1, wherein four indent portions are formed on the four corners of the base plate and the electrode layers are arranged on the indent portions.

4. The device according to claim 1, wherein the resistor chips are current limiting resistors.

5. The device according to claim 1, wherein the fuse wires of the wire set are gold wires.

6. The device according to claim 1, wherein the encapsulator is made of transparent epoxy resin.

* * * * *